United States Patent [19]

Kitchin et al.

[11] Patent Number: 4,814,827

[45] Date of Patent: Mar. 21, 1989

[54] PHOTOGRAPHIC COLOR PROOFING APPARATUS

[75] Inventors: Jonathan P. Kitchin, Hertford; Stephen R. Powers, Harlow; Keith A. Penfound, Saffron Walden; Peter J. Finn, Harlow; Michael G. Fisher, Epping, all of England

[73] Assignee: Minnesota Mining and Manufacturing Company, St. Paul, Minn.

[21] Appl. No.: 84,850

[22] Filed: Aug. 13, 1987

Related U.S. Application Data

[62] Division of Ser. No. 835,629, Mar. 3, 1986, Pat. No. 4,705,745.

[51] Int. Cl.⁴ .................. G03B 27/54; G03B 27/76
[52] U.S. Cl. .................................. 355/37; 355/32; 355/38; 355/70; 355/71; 430/505; 430/508; 430/565
[58] Field of Search ............... 430/358, 356, 505, 303, 430/508, 293, 565; 355/37, 70, 71, 38, 32

[56] References Cited

U.S. PATENT DOCUMENTS

| | | | |
|---|---|---|---|
| 3,199,402 | 8/1965 | Hunt et al. | 355/37 |
| 3,825,335 | 7/1974 | Reynolds | 355/37 |
| 3,841,752 | 10/1974 | Terajima | 355/37 |
| 3,914,721 | 10/1975 | Pollock | 355/37 |
| 3,950,093 | 4/1976 | Schneider | 355/37 |
| 4,124,292 | 11/1978 | Van Wandelen | 355/37 |
| 4,188,111 | 2/1980 | Marvin | 355/37 |
| 4,705,745 | 11/1987 | Kitchin et al. | 430/505 |

*Primary Examiner*—Mukund J. Shah
*Attorney, Agent, or Firm*—Donald M. Sell; Walter N. Kirn; Mark A. Litman

[57] ABSTRACT

A radiation-sensitive element for half tone color proofing adapted to be exposed by scanning with four independently modulated sources of radiation emitting at different wavelengths within the range 550 to 900 nm, the element comprising a substrate bearing at least four separate imaging media coated thereon, said imaging media including:

(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing, and
(4) an imaging medium capable of forming a black or a balancing black image upon imagewise exposure and processing, each imaging medium having a maximum spectral sensitivity at a wavelength different from that of the maximum sensitivity of the other imaging media such that after exposure and processing super-imposed yellow, magenta, cyan and black or balancing black images are formed, each image being attributable to the imagewise exposure of the respective source. Three layer elements of forming yellow, magenta and cyan images may be used for preparing half-tone full color images. Exposure apparatus comprising at least three independently modulated sources, preferably semiconductor sources emitting in the region of 550 to 900 nm may be used for imaging.

19 Claims, No Drawings

PHOTOGRAPHIC COLOR PROOFING APPARATUS

This is a division of application Ser. No. 835,629 filed Mar. 3, 1986, now U.S. Pat. No. 4,705,745.

FIELD OF THE INVENTION

This invention relates to radiation-sensitive elements and in particular to radiation-sensitive elements suitable for colour proofing, to methods of colour proofing and apparatus for use therein. A further aspect of the invention relates to a process of forming a half-tone colour image and to apparatus for use therein.

BACKGROUND OF THE INVENTION

The process of colour printing by photolithography involves the separation of the colours of the image into a number of components (usually four) to be reproduced by printing inks of corresponding colour (usually yellow, magenta, cyan and black).

Each colour separation is converted into the form of a halftone dot pattern by which tone rendition is achieved in lithographic printing. The perceived density of a particular colour on the final print depends on the relative size of the halftone dots in that area. It has recently become the practice to carry out both the colour separation and the generation of halftone dots automatically using a colour separation scanner of the electronic dot generation (EDG) type. The four halftone separation images are processed electronically and output separately onto black and White silver halide films using a scanned laser device. The printing plates are prepared from these four silver images or their duplicates by contact exposure. A further development in this area is the increasing use of electronic pagination systems which can manipulate the digitally stored image data for the purpose of page composition.

A very desirable adjunct to the electronic scanner and pagination systems is a method of producing a colour proof directly from the electronically stored data without the requirement for intermediate black and white images on silver halide film.

Several methods for the production of colour proofs directly from electronically stored images are known. It is possible to represent the image on a colour cathode ray tube which may be Photographed using any of the commercially available colour photographic materials. Alternatively, a black and white cathode ray tube may be photographed sequentially through different spectral filters. A more sophisticated device which has become available enables the image to be scanned in continuous tone form onto conventional photographic colour paper using blue, green and red light from argon-ion and helium-neon lasers. An additional method is to use the signals to a colour TV monitor to drive a continuous tone scanning device which uses a white light source through red, green and blue filters, to expose a diffusion transfer material.

There are fundamental limitations to the usefulness of the known direct colour proofing methods. In particular, it is not possible to record the image in the exact form that it will finally appear, that is, as superimposed yellow, magenta, cyan and black images of halftone structure.

In one respect, this limitation is imposed by the selection of photographic colour materials which are available. All of the silver halide colour recording materials presently available which work by the subtractive principle produce images which are formed from dyes of three colours: yellow, magenta and cyan.

It is recognised in the printing industry that a colour proof should be an exact representation of the final printed image produced from four superimposed halftone images in yellow, cyan, magenta and black inks. This is not readily feasible using a colour material which cannot form a black image independent of the other colours. To produce a "proof" using present colour photographic materials the yellow, magenta and cyan images have to be modified to compensate for the absence of a black layer. The result is, therefore, one stage removed from a genuine proof.

A further drawback of known methods employing conventional colour photographic materials is the limitation that the final images are of the continuous tone type rather than the halftone form of the final printed image. Since one of the principal reasons for making proof is to check whether the sizes of the yellow, magenta, cyan and black halftone dots are correct to produce the desired hue and tone the proof should be composed of halftone dots rather than continuously varying density calculated to produce the same visual effect. The current use of continuous tone exposures is probably dictated by the resolution of the imaging devices in use, the extra equipment cost for computing equivalent yellow, magenta and cyan halftones to the yellow, magenta, cyan and black halftones, the low to medium contrast of commercially available photographic colour materials which makes them not ideal for halftone exposures, and the limited resolution of conventional chromogenic colour paper.

For these reasons the direct colour proofing methods presently available have not achieved widespread acceptance except as a check on page layout and composition. It is still common practice to produce high quality colour proofs either by actually printing on a special press or by laminating together individual yellow, magenta, cyan and black images formed in various ways by contact exposure through halftone separations on black and white film. These methods are generally time consuming and often require skill on the part of the operator.

SUMMARY OF THE INVENTION

In accordance with one aspect of the present invention there is provided a radiation-sensitive element suitable for colour proofing comprising a substrate bearing at least four separate imaging media coated thereon, said imaging media including:

(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing, and
(4) an imaging medium capable of forming a black or a balancing black image upon imagewise exposure and processing, each imaging medium having a maximum spectral sensitivity at a wavelength different from that of the maximum sensitivity of the other imaging media.

In accordance with a second aspect of the invention there is provided a process for producing a coloured half-tone image comprising providing a light sensitive element comprising a substrate bearing three separate imaging media coated thereon, said imaging media consisting of:

(1) an imaging medium capable of forming a yellow image upon imagewise exposure and processing,
(2) an imaging medium capable of forming a magenta image upon imagewise exposure and processing, and
(3) an imaging medium capable of forming a cyan image upon imagewise exposure and processing, each imaging medium having a maximum spectral sensitivity at a wavelength different from that of the maximum spectral sensitivity of the other imaging media and a sensitivity at the wavelength of maximum spectral sensitivity of any of said other imaging media which is not significant compared to the maximum sensitivity of said other media, exposing said element to three independently modulated sources each emitting radiation of a wavelength corresponding to the wavelength of maximum sensitivity of a respective imaging medium, said exposure being conducted in raster fashion.

In accordance with a further aspect of the invention there is provided exposure apparatus comprising at least three independent sources of radiation of different wavelengths, each having a peak emission within the wavelength range of 550 to 900 nm, the intensity of said sources increasing from the source of shortest wavelength to the source of longest wavelength such that the source of the longest wavelength has an intensity of at least 10 times greater than the source of the shortest wavelength, the exposure apparatus being constructed and arranged such that each source or its emission may be modulated and the emitted radiation from said sources may simultaneously expose a radiation-sensitive element.

DETAILED DESCRIPTION OF THE INVENTION

The four layer elements of the invention are particularly suitable for the generation of highly accurate halftone colour proofs. The element is exposed by the four independent sources of different wavelengths and image formation in each layer is attributable only to a single source. Thus each layer may be truly representative of the printing plate used to apply the corresponding ink in the printing process.

The elements of the invention are based on an entirely different principle to conventional colour photographic silver halide elements. Conventional elements produce a colour image by combinations of cyan, magenta and yellow dyes and the wavelength of the exposing radiation causes image formation with a dye having the same wavelength within its principal absorption band. Thus a black image is formed by a combination of all three dyes generated by exposure of different wavelengths and there is no provision for generating black or balancing black by exposure to a single wavelength. The elements of the present invention utilize false-colour address in order to separate magenta, cyan, yellow and black. Thus the wavelength of the exposing source used to indicate a particular photosensitive layer is entirely independent of the colour generated in that layer. For example, a magenta separation may be digitised and thereafter cause an infra-red sensitive source to expose an imaging layer sensitive to infra-red. This material, on processing, generates a magenta image. Hitherto false-colour address has been used only for specialised image recording, e.g. infra-red aerial photography and X-ray photograpy and the elements used have not possessed the four layers of the elements of the invention.

The imaging media of the elements of the invention are selected such that not only does each medium have a maximum spectral sensitivity at a wavelength which is different from the wavelengths of maximum spectral sensitivity of the other imaging media but each imaging medium has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium. Thus, upon irradiation by four independent sources having wavelengths corresponding to the maximum spectral sensitivity of the layers and subsequent processing, the elements of the invention form super-imposed yellow, magenta, cyan and black or balancing black images, each image being attributable to the image-wise exposure of the respective source.

The elements of the invention can be utilised as a colour proofing system which can produce four colour halftone proofs of high accuracy directly from electronically processed halftone separation image data. The digitally processed images are used to modulate independent sources of actinic radiation, e.g. light emitting diodes (LED), laser diodes or infrared emitting diodes (IRED), which are selected to emit at the maximum spectral sensitivity of the medium corresponding to the digitally processed image. The four independent exposures may be conducted simultaneously or sequentially since the spectral sensitivities of the imaging media are selected such that exposure from one source will cause imaging formation in one imaging medium but not significantly affect the other imaging media.

References to "yellow" dye or image herein refers to one which has an absorbance principally within the 400 to 500 nm region of the visible spectrum.

References to a "magenta" dye or image herein refers to one which has an absorbance principally within the 500 to 600 nm region.

References to a "cyan" dye or image herein refers to one which has an absorbance principally within the 600 to 700 nm region.

It is preferred that the black image should have a visible absorption resembling that of black printing inks and references to a "black" image herein refers to one that absorbs light to a similar extent throughout the 400 nm to 700 nm region of the spectrum.

In one embodiment of the invention, the black separation image may be formed by imaging all three of the yellow, magenta and cyan layers in addition to a "balancing black" layer. In this case the function of the "balancing black" image would be to adjust the hue and/or the density of the colour formed from the combination of yellow, magenta and cyan layers to achieve the desired shade of black. Therefore, in this case the "balancing black" layer would not necessarily be of neutral hue by itself. Thus it would be known from the sum of the individual densities of the cyan, magenta and yellow components that there was insufficient absorbance to give a true black. A balancing black layer would contain additional dyes such that when their densities were added to the sum of the magenta, cyan and yellow there would be an essentially similar, even absorbance across the visible region of the spectrum.

The individual imaging media generally consist of a single layer containing photographic silver halide, a spectral sensitising dye and associate colour chemistry e.g. silver dye-bleach, dye diffusion transfer and colour coupling. However it is possible that some or all of the imaging media may be formed of two adajcent layers having the image forming components distributed therein. Furthermore it is possible to combine two or more imaging media into a single layer e.g by microencapsulation of components.

The imaging media generate a visible stable image after processing. The processing conditions will depend upon the particular type of imaging media used and may involve the application of external chemistry, e.g in the form of development baths. In the case of dry silver systems the processing simply requires the application of heat. In the interests of brevity the specification will simply refer hereinafter to imaging layers.

The requirements, described above, for a four colour halftone system for producing colour proofs direct from digitally processed images can be fulfilled in the following way.

Four light sensitive silver halide layers capable of producing respectively yellow, magenta, cyan and black or balancing black images are coated on a substrate. The sensitivities of the individual layers are matched to the output of four light emitting diodes and/or laser diodes and/or infrared emitting diodes. The light sources are mounted on a scanning device which is used to expose the sensitive coating. The four colour separation images are recorded simultaneously in the yellow, magenta, cyan and black producing layers.

The individual emissions of the four exposing devices are preferably selected from the range 550 to 900 nm. Whilst the individual emission could be selected from within a much broader wavelength band there are certain advantages in selecting emissions within the range 550 to 900 nm. Firstly, this region allows safelight handling of the elements in blue/green light. If required the element may additionally be provided with a bleachable yellow filter to improve safelighting properties. A further reason for the choice of red and infrared emitting sources is the ready availability of relatively high powered semiconductor devices in this region. Suitable, commercially available exposing sources include:

660 nm a light emitting diode (LED), part No. H2K commercially available from Stanley Electric Company, Semiconductor Division, Japan 735 nm an emitting diode, part No. HLP40RA, commercially available from Hitachi Electronic Components (UK) Limited, 221-225 Station Road, Harrow, Middlesex 780 nm an infrared emitting diode (IRED), part No. HLP60RB, commercially available from Hitachi Electronic Components (UK) Limited, and a laser diode, part No. LT-024MD, commercially available from Sharp Corporation, Osaka, Japan 830 nm an infrared emitting diode (IRED), part No. HLP60RC, commercially available from Hitachi Electronic Components (UK) Limited, and a laser diode, part No. LT-015MD, commercially available from Sharp Corporation, Osaka, Japan In order to ensure that only the intended layer is exposed by any particular light source it is very desirable that the sensitive layers should exhibit high contrast or, more precisely, a very short exposure range from maximum density to minimum density. A high photographic contrast is also a requirement for accurate recording of halftone images where it is desirable that exposure will generate either a full response or zero response. Preferably the sensitometric contrast of each imaging layer is sufficiently high that the difference between the exposure required to give a density which is 5% of the maximum density above fog and the exposure required to give a density which is 90% of the maximum density above fog is less than 1.5 log exposure units.

Spectral sensitisation of silver halide by dyes produces a sensitivity peak which usually falls off much more sharply to the long wavelength side than it does to shorter wavelength. Increased colour separation can therefore be achieved if the sensitivities of the four layers (at the wavelength of maximum spectral sensitivities) decrease from the layer of shortest wavelength sensitivity to the layer of longest wavelength sensitivity. Preferably the sensitivity decreases to a value less than 5% more preferably less than 2%. Generally, the minimum difference in sensitivity between any two layers is at least 0.2 log E units.

It is of fundamental importance for colour proofing that the images in the four sensitive layers are recorded in halftone dot form. The significance of halftone structure to the utility and accuracy of the proof has already been described. A further advantage of recording in halftone form is that it allows a much greater tolerance in the exposing power of the exposing device than would be permissable for recording a continuous tone image. Another practical advantage of recording the images in halftone form concerns the black, image-forming layer. It is generally necessary to form a black image using a mixture of yellow, magenta and cyan dyes together in the same layer. If a continuous tone imaging process were used it would be necessary to exactly match the rates of formation of the yellow, magenta and cyan components of the black image in order to maintain a neutral black hue throughout the range of intermediate grey tones. However, if the black tonal range is achieved using halftone dots there is no such requirement, since no intermediate levels of dye formation are used, only complete dye density in the dots or zero dye density between the dots.

The image-forming layers represented in the elements of the invention are preferably silver halide emulsions which may be of the silver dye-bleach type or in which the dye images are formed by a colour coupler process or a dye diffusion transfer process. Silver dye-bleach systems are preferred because of high resolution and inherent high contrast of such systems, these being desirable characteristics for halftone recording. An additional advantage is that the density and hue of the various layers may be controlled during film manufacture.

Silver dye-bleach, dye diffusion transfer and colour coupler imaging systems are well known and are disclosed, for example, in "The Theory of the Photographic Process", 4th Edition, Mees & James, Macmillan Publishing Co. Inc., pages 353 to 372, "Dye Diffusion Systems in Colour photography", Van de Sande, Angew. Chem. Int. Ed. Engl. 22 (1983), pages 191 to 209, and "Imaging Systems", Jacobson & Jacobson, Focal Press, 1976 pages 86 to 103.

Image forming layers of the dye diffusion transfer type rely on the imagewise diffusion of preformed dyes from the imaging layer to a mordant containing receptor layer. The final coloured image is formed in the receptor layer which may subsequently be separated from the imaging layer. A comprehensive review of chemical mechanisms by which imagewise dye diffusion may be achieved is given, for example, in "Dye Diffusion Systems in Colour Photography" Angewandte Chemie International Edition 1983, 22, 91–209. The preferred types of dye diffusion transfer for the practice of this invention are:

The system employing 'dye developers' which are dye molecules linked to one or more hydroquinone developing moiety. This is described in detail in "The Chemistry of Synthetic Dyes", K. Venkataraman, Vol. VIII, chapter 8, New York, Academic Press, 1978.

The system employing "Redox dye release" molecules such as those of the ortho- or parasulphonamidophenol or sulphonamidonaphthol types described, for example, in "The Theory of the Photographic Process", T. H. James, 4th Edition, page 370 New York, Macmillan, 1977.

The system employing sulphonomethylene derivatives of quinones as described in European Patent Application No. 4,399.

Image forming layers of the colour coupler type rely on the colour forming reaction between a 'colour coupler' which is usually incorporated in the imaging layer and oxidised colour developing agent. A review of materials which may be used in constructions of this type is given in "Research Disclosure" Vol. 187 item 18716, 1979.

In addition to the photosensitive image-forming media described above it is also possible to employ colour photothermographic media of the dry silver type, such as disclosed in U.S. Pat. No. 4460681. Silver halide photothermographic imaging materials essentially comprise a light sensitive, reducible silver source, a light sensitive material which generates silver when irradiated and a reducing agent for the silver source. The light sensitive material is generally photographic silver halide which must be in catalytic proximity to the light insensitive silver source. The silver sources used in this area of technology are materials which contain silver ions, the earliest and still preferred source comprising silver salts of long chain, carboxylic acids usually of :rom 10 to 30 carbon atoms, the silver salt of behenic acid or mixtures of acids of light molecular weight have been primarily used. It is possible to prepare multi-colour, photothermographic imaging articles by providing various colour forming layers maintained distinct from each other on generally a film base.

As with conventional silver halide, a four layer construction would be prepared comprising yellow, magenta and cyan colour formation media and additionally a black colour formation medium. As With the conventional silver halide materials, the individual colour generating layers in dry silver are preferably sensitised to separate wavelengths within the range of 550 to 900 nm. These materials may also be rendered sensitive to narrow band radiation within the range of 550 to 900 nm and a similar difference in sensitivities of the layers is desirable in order to enhance colour separation.

In conventional colour photographic materials it is usual for each of the three sensitive layers to form a dye image which is complementary in colour to the light to which that layer is sensitive. In the present invention the image forming layers may generate an image the colour of which is unrelated to that of the exposing source. Thus, subject to some restrictions, each of the four colour, image-forming layers of the present invention may be sensitive to any of the four exposing wavelengths chosen. Furthermore, several variations in the order of coating the four layers on the base are possible. In the case of a four colour, silver dye-bleach material some restrictions are imposed by the presence of the image dyes during exposure. In this case it is preferable that the yellow, cyan and magenta dyes are present in the layers furthest from the base in order to afford some safelight protection to the lower layers. Clearly any layers Which are sensitive to wavelengths shorter than about 700 nm should be nearer to the exposing source than the layers which contain the cyan and black dyes.

The layer which contains the cyan dye, if suitably placed, may act as a filter layer to increase the colour separation between any layers sensitive to wavelengths shorter than 700 nm and any layers of wavelength longer than 700 nm. Additional bleachable filter layers may be coated above the sensitive layers in order to improve the safelight handling of the construction. These filter layers may contain bleachable dyes or, in the case of a silver dye-bleach construction, yellow colloidal silver which may also be in combination with an azo dye.

The light sensitive layers may be coated on any suitable opaque or transparent base. The construction preferably incorporates an antihalation backing, or in the case of opaque base an antihalation underlayer. The antihalation layer may contain bleachable dyes, black colloidal silver may be used, or a strippable layer of pigment e.g. carbon black, and mixtures of dyes may be used.

Thus elements in accordance with the invention may comprise the following layers:
PROTECTIVE LAYER
MAGENTA LAYER
INTER LAYER
CYAN LAYER (OR YELLOW LAYER)
INTER LAYER
YELLOW LAYER (OR CYAN LAYER)
INTER LAYER
BLACK LAYER
INTER LAYER
BLACK COLLOIDAL SILVER LAYER
BASE The interlayers and protective layers may conveniently comprise gelatin layers. A wide variety of sensitising dyes may be used to sensitise the individual photosensitive layers to yellow, red and near infrared light; these have been well documented in the literature. There is no particular restriction as to the composition of the silver halide emulsion which may be used in this invention although emulsion types which produce high photographic contrast are preferred. Methods for the preparation of high contrast silver halide emulsions are well known.

Silver halide emulsion of narrow grain size distribution are particularly useful in this respect. The photographic contrast of the emulsion may be further increased by the incorporation of elements of Group 8 of the Periodic Table, such as rhodium. The effect of rhodium is not only to increase the contrast of a silver halide emulsion but to decrease the sensitivity. The effect on emulsion sensitivity may be used to advantage in providing a sensitivity differential between the emulsion layers thereby improving colour separation as described above.

It has been found that with a suitable selection of Cyan Magenta and Yellow image-forming layers of the type described above, it is possible to utilise a three-layer element to produce coloured half-tone images. In general, such elements will not be acceptable for colour proofing since there will be no separate black or balancing black layers and accordingly there will be no direct match with printing inks. However, the elements may he used to prepare quality coloured half-tone images. The use of a half-tone imaging process has several advantages over a conventional continuous tone photographic reproduction, allowing more latitude in processing conditions whilst achieving consistency of reproduction and enabling electronic attenuation of the digitised separations to provide latitude for image formations.

The sensitometric contrast of each of the three imaging layers is preferably sufficiently high that the difference between the exposure required to give a density which is 5% of the maximum density above fog and the exposure required to give a density which is 90% of the maximum density above fog is less than 2.0 preferably less than 1.5 log exposure units. The sensitivities of the layers at the wavelength of maximum sensitivity preferably decreases from the layer of shortest wavelength sensitivity to the layer of longest wavelength sensitivity which sensitivity decreases to a value of less than 10% preferably 5% more preferably less than 2%. Generally, the minimum difference in sensitivity between any two layers is at least 0.2 log E units. The three-layer element may be utilised to generate a coloured half-tone dot image by exposure to three independently modulated sources. The black component of the desired image is obtained by combination of the yellow, magenta and cyan in the same manner as in conventional colour photography.

For the three layer system it is preferred that the light sources emit light with a wavelength at peak intensity in the range 550 nm to 900 nm and the wavelength separation between any two of the three different wavelengths at least 20 nm.

One way of obtaining a dense black with a three layer (YMC) material, whilst still matching each of the YMC to the printing inks is to coat each of the YMC imaging layers at a high density and then to partially expose the appropriate layers when attempting to produce any colour other than black. Thus, the dye densities would be chosen such that when all three are combined together the result is a dense black. However, to Produce yellow (say), the exposure of the magenta and cyan layers would be such so as to produce no magenta or cyan, but the exposure of the yellow layer would be such so as to produce an amount of yellow dye less than its maximum density but sufficient to exactly match the yellow printing ink. Similar techniques would be used to produce magenta and cyan, or red, green and blue through appropriate combinations of yellow, cyan and magenta.

A disadvantage of this technique is that the resulting colours would be critically dependent on the precise value of the intermediate exposure and on processing variations. However, this problem may be obviated by utilizing two silver halide emulsions of different sensitivities within each colour forming layer. Such a layer would have a characteristics curve having a point of inflexion such as that shown in FIG. 1 of the accompanying drawings which represents a plot of dye density (D), after processing against log exposure (E) for a negative acting material. The technique would work equally well for either positive or negative systems.

The stepped nature of the curve in FIG. 1 is due to the presence of the two emulsion types. The faster of the two emulsions will be exposed at low log(E) values. This leads to the initial increase in dye density denoted A on the curve. The slower emulsion requires a higher exposure and produces the second density increase B.

There exists a region of constant density with exposure XY in which dye density will be independent of exposure value and processing conditions.

By choosing an appropriate amount of the fast emulsion it is thus possible to produce an intermediate dye density Dint which will match the density of the corresponding printing ink.

During exposure on a scanner the intensity of light emitted by each of the three light sources will function of the present or absence of a dot of each of the four colours. Essentially, for a negative acting material a high exposure must be given wherever a black (K) dot is present. In areas where black dots are not present a Zero or medium exposure is required. A logic-table showing the relationship between dot colour and exposure for a negative acting material on white reflective base is shown below:

| Logic Table (Negative-Acting Material) | | | | | | | |
|---|---|---|---|---|---|---|---|
| Dot Required | | | | Exposure Needed | | | |
| Y | M | C | K | Y | M | C | Colour |
| No | No | No | No | Zero | Zero | Zero | White |
| Yes | No | No | No | Medium | Zero | Zero | Yellow |
| No | Yes | No | No | Zero | Medium | Zero | Magenta |
| No | No | Yes | No | Zero | Zero | Medium | Cyan |
| No | Yes | Yes | No | Zero | Medium | Medium | Blue |
| Yes | No | Yes | No | Medium | Zero | Medium | Green |
| Yes | Yes | No | No | Medium | Medium | Zero | Red |
| No | No | No | Yes | High | High | High | Black |
| Yes | No | No | Yes | High | High | High | Black |
| Yes | Yes | Yes | Yes | High | High | High | Black |

As described above, the radiation-sensitive elements of the invention may be exposed by three or four (depending on Whether the element has a separate black or balancing black layer) independent sources of actinic radiation which are modulated to represent the particular colour requirement of the desired image. whilst the exposures may take place sequentially it is preferred that the elements are exposed to the four sources simultaneously in order to avoid the necessity for scanning the elements upon three or four separate occasions. An element is scanned in a raster fashion, either by moving the element rapidly in one direction whilst the exposing beams are moved more slowly in a perpendicular direction, or by moving the writing beams rapidly in one direction whilst the element is moved more slowly in a perpendicular direction, or by moving the writing beams rapidly in one direction and more slowly in a perpendicular direction. Preferably a combination of sources of the same wavelength is used for exposure so that dot arrays of each wavelength are formed. This permits faster scanning rates.

Therefore according to a different aspect of the invention there is provided an exposure device comprising at least three independent sources of radiation having a peak emission within the range 550 to 900 nm and of substantially different wavelength, preferably each source having a peak wavelength differing by at least 20 nm from that of any other of said sources, constructed and arranged such that each source or its emission may be modulated and the emitted radiation from said sources may simultaneously expose a radiation-sensitive element. Preferably there is an intensity variation between the sources of different wavelength such that the intensity of the source of longest wavelength will be at least ten times greater than the intensity of the source of shortest wavelength. The sources may comprise lasers, LED's, IRED's or any combination thereof and preferably semiconductor sources.

The exposure device may comprise more than one independently modulated sources at each of the different wavelengths, e.g. to provide an exposure head with six or more such sources at each of the different wavelengths. Arrays with tens or hundreds of independently modulated sources at each wavelength may also be used. The individual sources may be mounted together on a single chip in the form of an array. Such an array may consist of a single line of adjacent sources, or two or more staggered lines of sources, e.g. $5 \times 2$, $10 \times 2$, $12 \times 2$, etc. The arrays of sources of different wavelengths may be mounted together on a single chip. In this case, there would be one or more lines of sources emitting at one wavelength, and parallel to this would be one or more lines of sources emitting at one or more of the other wavelengths. The arrays of sources of different wavelengths may be mounted on separate chips. Radiation from the sources may be conveyed to an exposure head via optical fibres and the apparatus may include a lens system to focus each beam of radiation.

Further details of exposure devices of the invention are disclosed in FIGS. 2 to 5 of the accompanying drawings in which:

FIG. 2 represents a diagram of exposure apparatus suitable for use in the invention, FIG. 3 represents an enlarged diagram of the exposing head of FIG. 2, FIG. 4 represents an array suitable for use in the exposing head of FIG. 3, and FIG. 5 represents a schematic circuit diagram for controlling the exposing head.

Referring to FIG. 2, the radiation sensitive element (1) is wrapped around the outside of a cylindrical drum (2). The drum (2) is caused to rotate about its axis thus causing a section of the radiation sensitive element (1) to pass next to the exposing head (3). As the drum (2) rotates, the exposing head (3) moves in a direction parallel to the axis of the drum (2) so as to expose further strips of the radiation sensitive element (1).

The exposing head (3) is shown in more detail in FIG. 3. The exposing head (3 contains four separate arrays (4) of light emitting diodes (LED's), one at each of the four wavelengths of emission. The radiation emitted by the LED's is focused by four separate lens systems (5) to form images of the LED's at a reduced size on the radiation sensitive element (1). One of the arrays (4) of LED's is shown in more detail in FIG. 4. In this example, each array contains six independently modulated LED's (6) arranged in two rows of three. The two rows are staggered so that as the radiation sensitive element (1) moves past the exposing head (3) the images of the bottom row of LED's (6) fill in the spaces left by the images of the top row of LED's (6).

The output of each of the LED's (6) is controlled by the electronic system shown schematically in FIG. 5. The image data source (7) may be a mass storage unit such as magnetic disc, an input scanner, or any other suitable source. The image data is usually held in digital form, typically with 8 bits of resolution, in which case 256 separate values of image data can be represented for each of the yellow, magenta, cyan and black images. The image data passes through a delay circuit (8) which is used to compensate for the fact that the yellow, magenta, cyan and black images are exposed at different points around the circumference of the drum (2). The image data next passes to the electronic dot generating (EDG) circuitry (9). The EDG circuitry (9) individually controls the individual LED's (6) so as to expose half-tone dots of the correct size, shape and position. Variable resistors (10) may be used to adjust each of the LED's (6) to the same intensity. For the sake of clarity, only one array (4) of the LED's is depicted in FIG. 5. It should be understood that each EDG circuit (9) is similarly connected to a separate LED array (4).

The position of the delay circuit 8 may vary depending upon the element to be imaged. For example, in the case of an element having a balancing black layer delay circuits will be present on each output line for each LED.

The invention will now be illustrated by the following Examples.

EXAMPLE 1

By analogy with the commercially available Dai Nippon Screen Manufacturing Company Ltd. SGlll colour separation scanner which uses radiation centered on 667 nm from a light emitting diode array, it is known that a film sensitivity in the order of 1 erg cm$^{-2}$ is required for the most sensitive layer of the four layer construction. Sensitivities of this order have been achieved by suitable spectral sensitisation of a 0.4 micron 70:30 - AgCl:AgBr emulsion of narrow grain size distribution internally doped with rhodium and sulphur/gold sensitised.

The above described emulsion may be readily sensitised to different wavelengths.

A dye of structure 1 was used for sensitising this emulsion to 660 nm radiation.

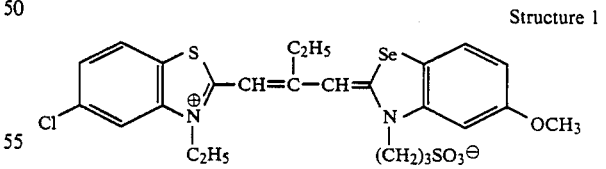

Structure 1

Dyes of general structure 2 was used to sensitise the emulsion in the 730 nm region.

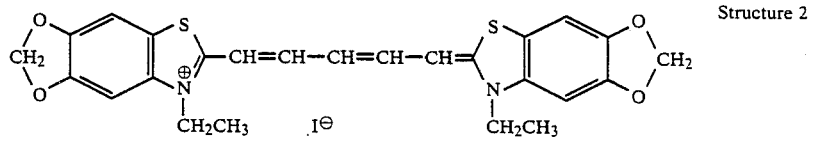

Structure 2

A dye, structure 3, disclosed by Simpson, McQuade and Boon, Minnesota Mining and Manufacturing Company, U.S. patent application Ser. No. 674,583 was used to sensitise the emulsion at 770 nm.

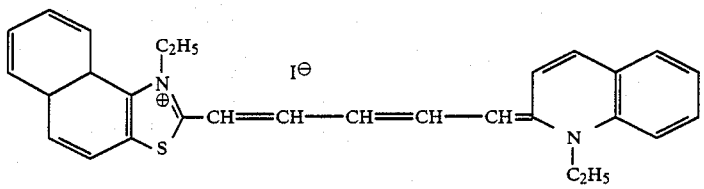

A dye of structure 4 was used for sensitisation at 830 nm.

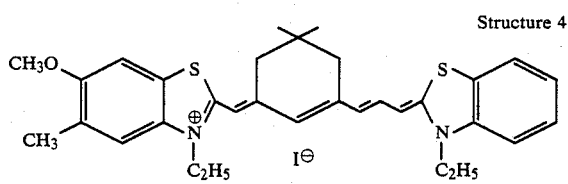

For a four colour recording construction of the silver dye-bleach type the following azo dye structures have been found to match the printing inks.

ener the mixture was coated onto subbed polyester base at a coverage of 7 mg silver per square decimetre.

A sample of this coating was exposed in a sensitometer to radiation from a 500 W tungsten filament lamp attenuated by a 830 nm narrow band-pass interference filter and a 0–4 continuous neutral density wedge.

The sample was developed in 3M RDC rapid access developer at 40° C. for 20 seconds, treated with Ilford Cibachrome P30 dye bleach solution at 25° C. for 3 minutes followed by fixing in 3M "Fixroll" rapid access fixer at 25° C. for 30 seconds. A positive yellow image was obtained with an exposure range (5% of Dmax to 90% of Dmax above fog) of 0.85 log exposure units.

Other imaging layers were formed in a similar manner.

Contact halftone exposures made on a cyan layer

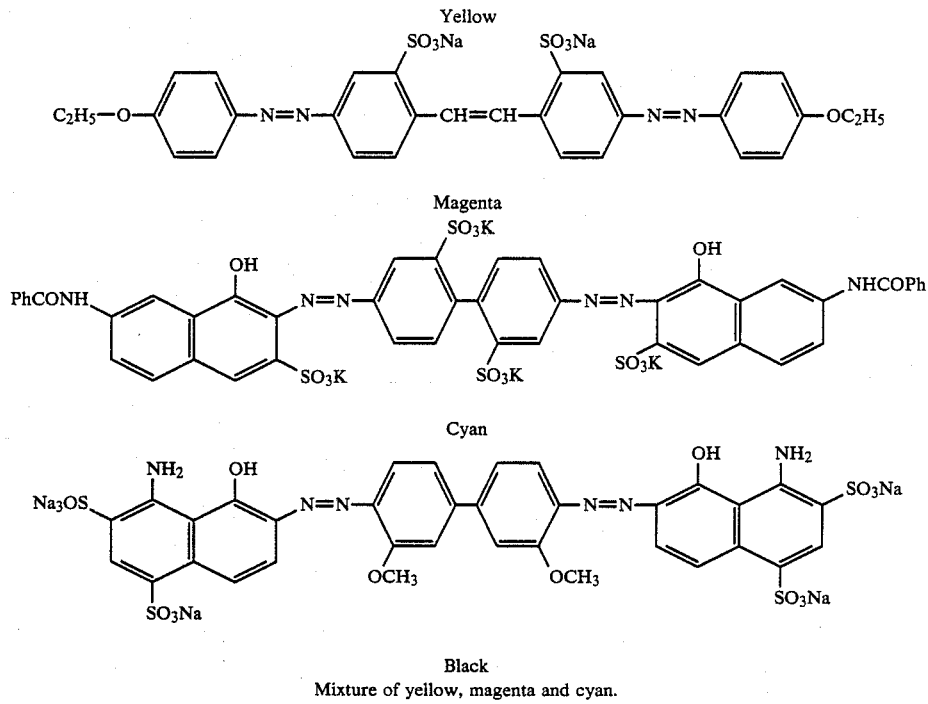

Individual colour forming layers have been prepared by the following technique.

Preparation of yellow image forming layer

A narrow grain size distribution cubic 70:30 AgCl:AgBr emulsion of 0.4 micron average edge length was prepared by the conventional double jet technique. The emulsion was gold and sulphur sensitised and the gelatin content adjusted to 80 g per mole of silver. To a 0.03 mole portion of the emulsion Was added 1.0 mg of sensitising dye of Structure 4 as a 0.4% solution in methanol and 1.0 g of yellow azo dye as a 5% solution in water. After the addition of a wetting agent and hardindicate that the dye-bleach process is capable of recording the tonal and dot structures necessary for 150 line screened image.

Overcoating of a green/red spectrally sensitised photographic material with a yellow colloidal silver layer produced a greater than 10 times decrease in blue speed without affecting the spectrally sensitised speed. Processing in a dye/bleach cycle destroyed the yellow silver layer. This effect may be used to provide safelighting capabilities in the shorter wavelengths of the visible spectrum.

EXAMPLE 2

4-colour layer materials

A narrow grain size distribution cubic 70/30 AgC-:AgBr emulsion (Emulsion A) of 0.4 micron average edge length was prepared by the conventional double-jet technique. The emulsion was sulphur and gold sensitised, and stabilised with a tetra-azaindene stabiliser.

4.5 ml of 4% TRITON X-200 solution (a sodium salt of an alleylaryl polyether sulphonate commercially available from Rohm and Haas)

4.5 g of magenta azo dye (structure 6) as a 3% aqueous solution 9 ml of 4% formaldehyde solution The pH adjusted to 6.0 and the total weight of the solution made up to 600 g.

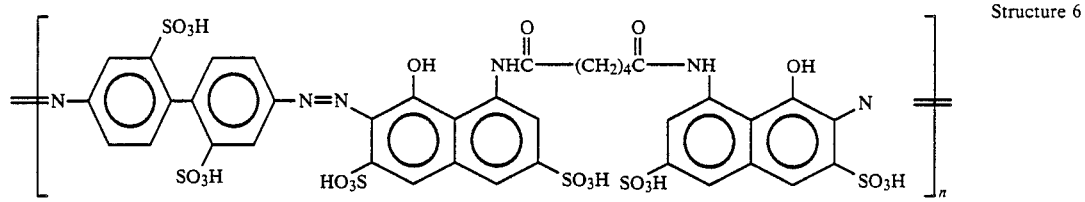

Structure 6

This emulsion was then used in the preparation of each of the four colour forming layers.

A. Preparation of magenta image forming layer (M layer)

0.06 mole of the Emulsion A was spectrally sensitized to radiation of 580 nm with 9 mg of sensitising dye of structure 5.

B. Preparation of cyan image forming layer (C layer)

0.03 moles of Emulsion (A) was spectrally sensitised to radiation of 660 nm with 6 mg of a sensitising dye of structure (1). The cyan forming layer was prepared with the same coating additions as layer M except that the magenta dye was replaced by 1.56 g of a cyan azo dye (structure 7), added as a 2% aqueous solution.

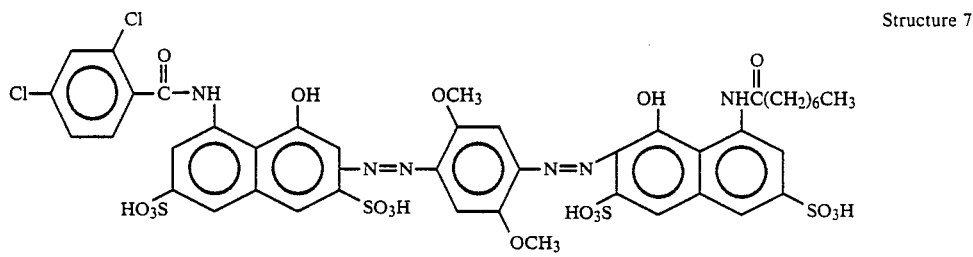

Structure 7

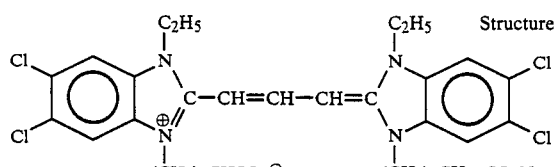

Structure 5

C. Preparation of yellow image forming layer (Y layer)

0.028 mole of Emulsion (A) Was spectrally sensitised to radiation of 730 nm with 0.7 g of sensitising dye of structure 2. The yellow forming layer was prepared similarly to layer M except that the magenta azo dye was replaced with 1.38 g of a yellow az dye (structure 8), added as a 2% aqueous solution.

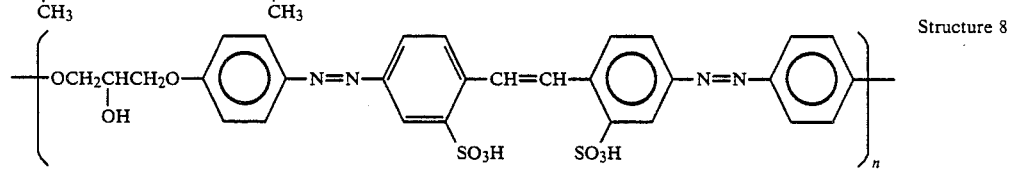

Structure 8

The following additions were made to the spectrally sensitised emulsion:
180 g of 10% gelatin solution

D. Preparation of a black imaging forming layer (K layer)

0.084 moles of emulsion (A) was spectrally sensitised to radiation of 830 nm with 0.83 mg of sensitising dye of structure 9.

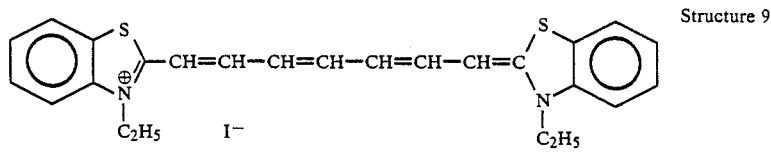

Structure 9

The "Black" forming layer was prepared similarly to the other colour layers except that a combination of the yellow, cyan and magenta azo dyes were used, in the proportions, 0.9 g yellow +3.6 g magenta +1.8 g cyan.

E. Construction of 4-colour layer material

The four colour image forming layers were coated consecutively onto a reflective polyester, which was itself coated with a black colloidal silver in gelatin layer, providing anti-halation protection throughout the visible and near infra-red region of the spectrum. This colloidal silver layer is removed during the dye-bleach processing cycle.

The layer order was such that the "black" colour layer was the nearest to the substrate, followed by the yellow, cyan and the magenta. The layers were coated to give the following silver coverages:

Magenta layer—0.4 g/m$^2$
Cyan layer—0.2 g/m$^2$
Yellow layer—0.2 g/m$^2$
Black layer—0.6 g/m$^2$ Gelatin interlayers of 2 micron dry thickness were coated between adjacent colour layers and between the black layer and the colloidal silver anti-halation layer. The magenta layer was overcoated with 0.6 micron thick protective gelatin layer.

F. Measurement of Photographic Properties

Exposures on samples of this element were made in a sensitometer to radiation from a tungsten filament lamp attenuated by narrow band-pass interference filters and a 0–4 continuous neutral density wedge. Exposures were made with narrow band-pass filters of 580 nm, 660 nm, 730 nm and 830 nm.

The samples were developed in 3M RDC rapid access developer for 20 seconds at 40° C., then treated with Ilford Cibachrome P22 dye, bleach and fix solutions both for 40 second and at 40° C. The sensitivities, in ergs/cm$^2$ to give a density of 0.1 above Dmin, of the colour forming layers were assessed at each of the four wavelength exposures and are reported in the following Table:

|  | 580 nm | 660 nm | 730 nm | 830 nm |
| --- | --- | --- | --- | --- |
| MAGENTA LAYER | 1.9 | 11464 | 60737 | — |
| CYAN LAYER | 57 | 6.3 | 19206 | — |
| YELLOW LAYER | 3620 | 263 | 44 | 7084 |
| BLACK LAYER | — | 3015 | 580 | 135 | indicates no recorded sensitivity.

The results indicate the sensitivites of the four layers, at the wavelength of maximum sensitivity, decrease sequentially from the top layer (magenta) to the bottom layer (black). The low sensitivities of the various layers to the exposure wavelengths other than the intended imaging wavelength and the short exposure range of each of the colour layers allow only the intended colour layer to be exposed by any particular light source.

The good colour separation that can be achieved with this material has been demonstrated practically with the production of a full colour photograph by contact exposures through magenta, cyan, yellow and black 150 line screened black and White half-tone separation positive.

EXAMPLE 3

3-colour layer material

A 3-colour layer material was constructed following the procedure described in Example 2, except that the black image forming layer was omitted. The element was subjected to the exposure and processing conditions used in Example 2, and the sensitivites in ergs/cm$^2$ to give a density of 0.1 above Dmin of the The solutions Were coated onto separate samples of reflective polyester base, itself coated with a black colloidal silver anti-halation underlayer and a 2 micron thick gelatin interlayer. The silver coverage of the single colour layer was 0.7 g/m$^2$ and this layer was overcoated with a 0.6 micron thick gelatin protective layer.

Both the yellow and magenta samples were of sufficient sensitivity to be imaged on a commercially available Dai Nippon Screen SG111 colour separation electronic dot generation scanner. The imaging source of the scanner being an array of light emitting diodes emitting at a wavelength of 667 nm. The scanned samples were processed under the same conditions as those described in Example 2. Both the yellow and the magenta single colour layers yielded half-tone positive images with excellent dot quality over the full tonal range for a screen ruling of 150 lines/inch. Half-tone dots within the range 3 to 97% were satisfactorily retained.

EXAMPLE 5

Imaging Media utilizing colour diffusion transfer

ELEMENT 1

A photographic element was prepared by coating sequentially the following three layers onto a subbed polyester film support.

(a) A layer consisting of yellow dye developer of structure 10 dispersed in gelatin. The coverage of dye was 5 mg/dm$^2$ and that of gelatin was 7.2 mg/dm$^2$. colour forming layers at each of the three wavelength exposures are reported in the following Table.

|  | 580 nm | 660 nm | 730 nm |
| --- | --- | --- | --- |
| MAGENTA LAYER | 1.7 | 10000 | 52000 |
| CYAN LAYER | 42.7 | 5.9 | 14320 |
| YELLOW LAYER | 2400 | 210 | 41.3 |

The sensitivities of the various layers to the different exposure wavelengths compare very similarly with those of the 4-layer material of Example 2. As with the material of Example 2, excellent colour separation can be achieved between the 3 colour layers.

EXAMPLE 4

Single colour layer material scanned on a colour separation scanner

The single colour layer was prepared as follows:

0.025 mole of Emulsion A (Example 2) was spectrally sensitised to radiation of 660 nm with 5 mg of a sensitiser dye of structure (1).

One emulsion was prepared for coating by addition of
609 of 10% gelatin solution
1.5 ml of 4% Triton X-200.
1 g of a yellow azo dye (structure 8)
3 ml of 4% formaldehyde solution.

The pH was adjusted to 6.0 and the total weight of the solution brought to 200 g.

A second emulsion was prepared as above except the yellow dye was replaced by 1.5 g of a magenta azo dye (structure 6).

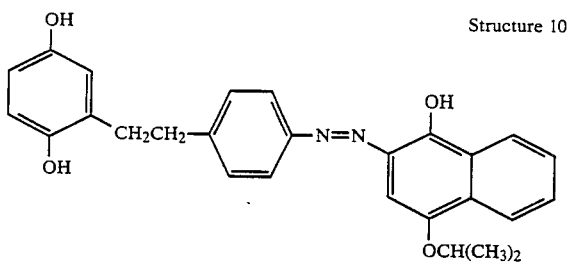

Structure 10

(b) A second layer consisting of a silver chlorobromide emulsion (36:64; Br:Cl) of 0.3 micron average grain size sensitised to 780 nm radiation by the addition of dye of structure 3 ($3 \times 10^{-4}$ moles dye/mole silver). The silver coverge was 5 mg/dm².

(c) A third layer consisting of 1-phenyl-5-pyrazolidinone (2.2 mg/dm²) dispersed in gelatin (14 mg/dm²).

ELEMENT 2

Element 2 was identical with Element 1, except that magenta dye developer of Structure 11 replaced the yellow dye developer in the first layer and the silver halide emulsion was sensitised not to 780 nm but to nm radiation by the addition of a sensitising dye of structure 4 ($5 \times 10^{-5}$ moles dye per mole silver).

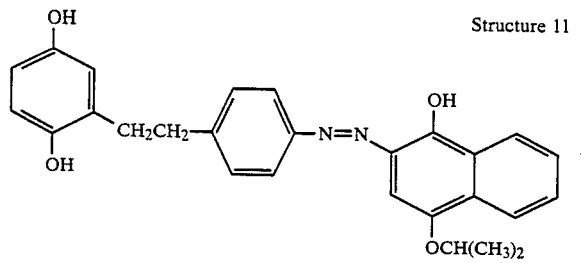

Structure 11

Evaluation

Five samples of Element 1 were separately exposed in a sensitometer to radiation from a 500 Watt tungsten filament lamp attenuated by a 0-4 continuous neutral density wedge and filtered by 730 nm, 760 nm, 820 nm, 850 nm or 880 nm narrow bandpass interference filters.

The samples were laminated to Agfa-Gevaert "Copycolor CCF" dye receptor sheets using an Agfa-Gevaert "CP 380" colour diffusion transfer processing machine containing 2% aqueous potassium hydroxide as processing solution. The receptor sheets were separated after one minute.

Element 1 showed a maximum sensitivity at 760 nm resulting in a positive yellow image on the receptor sheet. Element 1 exhibited no measurable sensitivity at 820 nm or longer wavelengths.

This test procedure was repeated with Element 2. In this case a sensitivity maximum at 820 nm was observed resulting in a positive magenta image. Element 2 was 0.57 Log Reciprocal exposure units less sensitive at 760 nm than 820 nm and 1.70 Log Reciprocal exposure units less sensitive at 880 nm than at 820 nm.

We claim:

1. Exposure apparatus comprising at least three independent sources of radiation of different wavelengths, each having a peak emission within the wavelength range of 550 to 900 nm, the intensity of said sources at the intended exposure plane of a radiation-sensitive element increasing from the source of shortest wavelength to the source of longest wavelength such that the source of the longest wavelength has an intensity of at least 10 times greater than the source of the shortest wavelength, the exposure apparatus being constructed and arranged such that each source or its emission may be modulated and the emitted radiation from said sources may in a single pass expose a radiation-sensitive element.

2. Exposure apparatus as claimed in claim 1, which comprises four independent sources of radiation of different wavelengths.

3. Apparatus as claimed in claim 1 in which the wavelengths of peak emission of any two sources of different wavelengths differ by at least 20 nm.

4. Apparatus as claimed in claim 1 in which each source is a semiconductor source.

5. Apparatus as claimed in claim 4 in which each source is selected from light emitting diodes, infra-red emitting diodes, and laser emitting diodes.

6. Apparatus as claimed in claim 1 which comprises a plurality of independent modulated sources at each of the different wavelengths.

7. Apparatus as claimed in claim 6 in which said plurality of independently modulated sources at each wavelength are arranged as a single line, or adjacent sources, or two or more staggered lines of sources.

8. Apparatus as claimed in claim 7 in which all of said sources are mounted on a single chip.

9. Apparatus as claimed in claim 2 in which the wavelengths of peak emission of any two sources of different wavelengths differ by at least 20 nm.

10. Apparatus as claimed in claim 2 in which each source is a semi-conductor source.

11. Apparatus as claimed in claim 3 in which each source is a semi-conductor source.

12. Apparatus as claim in claim 2 which comprises a plurality of independent modulated sources at each of the different wavelengths.

13. Apparatus as claim in claim 3 which comprises a plurality of independent modulated sources at each of the different wavelengths.

14. Apparatus as claim in claim 4 which comprises a plurality of independent modulated sources at each of the different wavelengths.

15. Apparatus as claim in claim 5 which comprises a plurality of independent modulated sources at each of the different wavelengths.

16. Apparatus as claimed in claim 2 in which said plurality of independently modulated sources at each wavelength are arranged as a single line, adjacent sources, or two or more staggered lines of sources.

17. Apparatus as claimed in claim 9 in which said plurality of independently modulated sources at each wavelength are arranged as a single line, adjacent sources, or two or more staggered lines of sources.

18. Apparatus as claimed in claim 11 in which said plurality of independently modulated sources at each wavelength are arranged as a single line, adjacent sources, or two or more staggered lines of sources.

19. Exposure apparatus comprising at least three independent sources of radiation of different wavelengths, each having a peak emission within the wavelength range of 550 to 900 nm, the intensity of said sources at the exposure plane of a radiation-sensitive element increasing from the source of shortest wavelength to the source of longest wavelength such that the source of the longest wavelength has an intensity at least 10 times greater than the source of the shortest wavelength, the exposure apparatus being constructed so that each source or its emission may be modulated and the emitted radiation from said sources may in a single pass expose a radiation-sensitive element through the exposure plane.

* * * * *